(12) United States Patent
Qiu

(10) Patent No.: US 7,409,134 B2
(45) Date of Patent: Aug. 5, 2008

(54) CONTROL OF OUTPUT BEAM DIVERGENCE IN A SEMICONDUCTOR WAVEGUIDE DEVICE

(75) Inventor: Bocang Qiu, Glasgow (GB)

(73) Assignee: Intense Limited (GB)

( * ) Notice: Subject to any disclaimer, the term of this patent is extended or adjusted under 35 U.S.C. 154(b) by 24 days.

(21) Appl. No.: 10/595,283

(22) PCT Filed: Sep. 16, 2004

(86) PCT No.: PCT/GB2004/003959
§ 371 (c)(1),
(2), (4) Date: Apr. 10, 2006

(87) PCT Pub. No.: WO2005/043702
PCT Pub. Date: May 12, 2005

(65) Prior Publication Data
US 2006/0274793 A1    Dec. 7, 2006

(30) Foreign Application Priority Data
Oct. 11, 2003    (GB)    ................ 0323905.0

(51) Int. Cl.
*G02B 6/10* (2006.01)
*H01S 3/10* (2006.01)
*H01S 5/00* (2006.01)

(52) U.S. Cl. .............. 385/129; 385/131; 385/144; 372/9; 372/45.01

(58) Field of Classification Search .......... None
See application file for complete search history.

(56) References Cited

U.S. PATENT DOCUMENTS

| | | | |
|---|---|---|---|
| 4,745,612 A | * | 5/1988 | Hayakawa et al. ....... 372/45.01 |
| 4,794,611 A | | 12/1988 | Hara et al. |
| 4,882,734 A | * | 11/1989 | Scifres et al. .......... 372/45.012 |
| 5,289,484 A | | 2/1994 | Hayakawa et al. |
| 5,812,578 A | | 9/1998 | Schemmann et al. |

(Continued)

FOREIGN PATENT DOCUMENTS

EP    0547044 A2    6/1993

(Continued)

OTHER PUBLICATIONS

Yang, G. et al., "Design and fabrication of 980nm InGaAs/AlGaAs quantum well lasers with low beam divergence", SPIE vol. 2886, pp. 258-263 (1996).

(Continued)

*Primary Examiner*—Rodney Bovernick
*Assistant Examiner*—Omar Rojas
(74) *Attorney, Agent, or Firm*—Momkus McCluskey, LLC; Jefferson Perkins

(57) ABSTRACT

A semiconductor laser device incorporates a beam control layer for reducing far field and beam divergence. Within the beam control layer, a physical property of the semiconductor material varies as a function of depth through, the beam control layer, by provision of a first sub-layer in which the property varies gradually from a first level to a second level, and a second sub-layer in which the property varies from said second level to a third level. In the preferred arrangement, the conduction band edge of the semiconductor has a V-shaped profile through the beam control layer.

16 Claims, 8 Drawing Sheets

U.S. PATENT DOCUMENTS

| | | | |
|---|---|---|---|
| 5,815,521 | A | 9/1998 | Hobson et al. |
| 5,923,689 | A | 7/1999 | Su et al. |
| 6,028,877 | A | 2/2000 | Kimura |
| 6,141,363 | A | 10/2000 | Ougazzaden et al. |
| 6,961,358 | B2 | 11/2005 | Erbert et al. |
| 2001/0028668 | A1 | 10/2001 | Fukunaga et al. |
| 2004/0047378 | A1 | 3/2004 | Erbert et al. |

FOREIGN PATENT DOCUMENTS

| | | |
|---|---|---|
| JP | 61-156788 A1 | 7/1986 |
| WO | 01/06608 A1 | 1/2001 |
| WO | 02/25787 A1 | 3/2002 |

OTHER PUBLICATIONS

Yen, S. et al., "Semiconductor lasers with unconventional cladding structures for small beam divergence and low threshold current", Optical and Quantum Electronics vol. 28, pp. 1229-1238 (1996).

Yen, S. et al., "980 nm InGaAs/AlGaAs quantum well lasers with extremely low beam divergence", Proc. of 15th IEEE International Semiconductor Laser Conference, pp. 13-14 (1996).

UK Patent Office, Search Report for GB 0323905.0 issued Nov. 9, 2004.

Wenzel, H. et al., "High-power diode lasers with small vertical beam divergence emitting at 808nm", Electronics Letters, vol. 37, No. 16, pp. 1024-1026 (Aug. 2, 2001), Great Britain.

Nayar, B. K. et al., "Novel high-power narrow-beam divergence tapered laser arrays at 980 nm", Technical Digest, Conference on Lasers and Electro-Optics, San Francisco, CA, May 3, 1988, pp. 39-40.

Vakhshoori, D. et al., "980 nm spread index laser with strain compensated InGaAs/GaAsp/InGaP and 90% fibre coupling efficiency", Electronics Letters vol. 32, No. 11, May 23, 1996, pp. 1007-1008, Great Britain.

Lay, T.S. et al., "Electro-modulation spectroscopy and laser performance of an InGaAsP asymmetric multi-quantum-well structure", Optics Communications, vol. 211, No. 1-6, Oct. 1, 2002, pp. 289-294, North-Holland Publishing Co., Amsterdam, Netherlands.

Buda, M. et al., "Asymmetric design of semiconductor laser diodes: thin p-clad and low divergence InGaAs/AlGaAs/GaAs devices", 15th Annual Meeting of the IEEE Lasers and Electro-Optics Society, vol. 1 of 2, pp. 647-648, Glasgow, Scotland, Nov. 13, 2002.

Smowton, P. M., et al., 650 nm lasers with narrow far-field divergence with integrated optical mode expansion layers, IEEE J. of Selected Topics in Quantum Electronics, vol. 5, No. 3, May 1999, pp. 735-739.

European Patent Office acting as the IPSA, Written Opinion in Appln. No. PCT/GB2004/003959, issued Apr. 18, 2006.

\* cited by examiner

CONTROL OF OUTPUT BEAM DIVERGENCE IN A SEMICONDUCTOR WAVEGUIDE DEVICE

BACKGROUND OF THE INVENTION

The present invention relates to semiconductor waveguide devices, and in particular to methods for controlling the optical output beam divergence therefrom.

The invention has particular, though not exclusive, use in the manufacture of semiconductor lasers, amplifiers, modulators and other waveguides suitable for use in telecommunications and printing applications where low coupling loss to other optical components (such as optical waveguides) and high kink-free power output is required. More particularly, the invention has particular, though not exclusive, use in the manufacture of 980 nm pump lasers for telecommunications applications, and in the manufacture of 830 nm high power lasers for printing applications.

Conventional semiconductor lasers generally provide an optical output beam of substantially elliptical cross-section. With reference to FIG. 1, such conventional lasers typically comprise a succession of layers formed on a substrate 10, to include a lower cladding layer 11, an optically active core region 12 and an upper cladding layer 13. In a conventional ridge type laser, lateral optical confinement is effected by way of a ridge waveguide 14 upon which suitable electrical contact material 15 may be deposited with which to provide electrical injection to drive the lasing mode. The resultant optical output beam 16 emerges from the output end 17 along the longitudinal or z-axis as shown.

The core region 12 typically comprises a plurality of layers, such as a central layer 12a defining the quantum well and two or more outer layers 12b, 12c with composition varying as a function of depth within the layer to provide a so-called graded index separate confinement heterostructure (GRIN-SCH) core region 12.

The structure of FIG. 1 provides a conduction band edge profile as shown in FIG. 2, in which the cladding region 20 corresponds to the lower cladding layer 11; the cladding region 24 corresponds to the upper cladding layer 13; the quantum well region 22 corresponds to the central layer 12a; and the graded index regions 21 and 23 respectively correspond to the outer layers 12b, 12c.

The output beam 16 (FIG. 1) from this structure typically has a beam divergence in the vertical direction (shown in the figure as the y-direction) of the order of between 30 and 40 degrees, resulting in a large vertical far field. Vertical direction is generally defined as the wafer growth direction, i.e. the direction that is orthogonal to the plane of the substrate, as shown. By contrast, beam divergence in the horizontal or lateral direction (shown in the figure as the x-direction) is typically of the order of between 5 and 10 degrees.

The very large far field and asymmetry of the far fields in the vertical and horizontal directions cause a number of problems such as high coupling loss to optical components downstream of the laser output 17 (such as optical fibres) and particularly low coupling tolerance between the laser and a single mode fibre (which requires a circular beam profile).

A number of techniques have been proposed to reduce the far field or beam divergence in the vertical direction and hence to reduce the asymmetry in far field output. The vertical far field can be reduced to some degree by simply reducing the thickness of the core region 12. However, in this case, optical overlap with the quantum well 12a is also reduced which in turn increases the laser threshold current and cavity loss occurs from losses associated with intervalence band absorption. In addition, it becomes more difficult to achieve high kink-free emission power due to the occurrence of higher mode lasing at high current injection levels.

A number of different approaches have been proposed to provide 'mode-shaping' layers that reduce far field into the semiconductor laser structure.

For example, U.S. Pat. No. 5,815,521 describes a laser device in which a mode-shaping layer is introduced into each one of the cladding layers. Each of the mode-shaping layers comprises a layer of increased refractive index relative to the rest of the respective cladding layer, to form a conduction band edge profile as shown in FIG. 1 of US '521. It is noted that the mode-shaping layers each comprise a localized step change in band energy level.

U.S. Pat. No. 5,923,689 describes another technique in which a pair of passive waveguides of reduced refractive index is provided on either side of the quantum well structure, separated therefrom by a barrier layer. A similar structure, this time also in conjunction with a graded index confinement structure, is also shown in "Semiconductor lasers with unconventional cladding structures for small beam divergence and low threshold current" by Shun-Tung Yen et al, Optical and Quantum Electronics 28 (1996) pp. 1229-1238. Both of these documents advocate a step-wise local reduction in refractive index within the cladding layers.

"Design and fabrication of 980 nm InGaAs/AlGaAs quantum well lasers with low beam divergence" by Guowen Yang et al, SPIE Vol. 2886 (1996), pp. 258-263 describes the insertion of two low refractive index layers inserted between the cladding and graded index layers to decrease beam divergence in the vertical direction.

"980 nm InGaAs/AlGaAs quantum well lasers with extremely low beam divergence" by Shun-Tung Yen et al, Proceedings of Semiconductor Laser Conference (1996), 15th IEEE International, pp. 13-14 also describes the introduction of two low refractive index layers respectively adjacent to the graded index layers also to reduce the vertical far field distribution.

U.S. Pat. No. 6,141,363 contemplates the reduction of beam divergence by means of a plurality of layers within the core region, of alternating high and low refractive index.

BRIEF SUMMARY OF THE INVENTION

It is an object of the present invention to provide a semiconductor waveguide device with reduced beam divergence in the vertical direction.

According to one aspect, the present invention provides a semiconductor optical waveguiding device comprising:
 a first cladding layer;
 a second cladding layer; and
 a waveguiding layer disposed between the first and second cladding layers and having a substantially higher refractive index than said first and second cladding layers;
 wherein at least one of the first and second cladding layers includes a beam control layer in which a property of the semiconductor material varies as a function of depth through the layer, the beam control layer including a first sub-layer in which the property varies gradually from a first level to a second level, and a second sub-layer in which the property varies gradually from said second level to a third level.

According to another aspect, the present invention provides a method of forming a semiconductor optical waveguiding device comprising the steps of:

forming a first cladding layer on a substrate;

forming a waveguiding layer on said first cladding layer, the waveguiding layer having a refractive index substantially greater than the first cladding layer;

forming a second cladding layer on said waveguiding layer, the second cladding layer having a refractive index substantially less than the waveguiding layer; and during the step of forming said first cladding layer, forming a beam control layer therein by gradually modifying deposition conditions so as to vary a property of the semiconductor material as a function of depth through the beam control layer, such that the beam control layer includes a first sub-layer in which the property varies gradually from a first level to a second level, and a second sub-layer in which the property varies gradually from said second level to a third level.

BRIEF DESCRIPTION OF THE DRAWINGS

Embodiments of the present invention will now be described by way of example and with reference to the accompanying drawings in which.

DETAILED DESCRIPTION OF THE INVENTION

Figure 1:
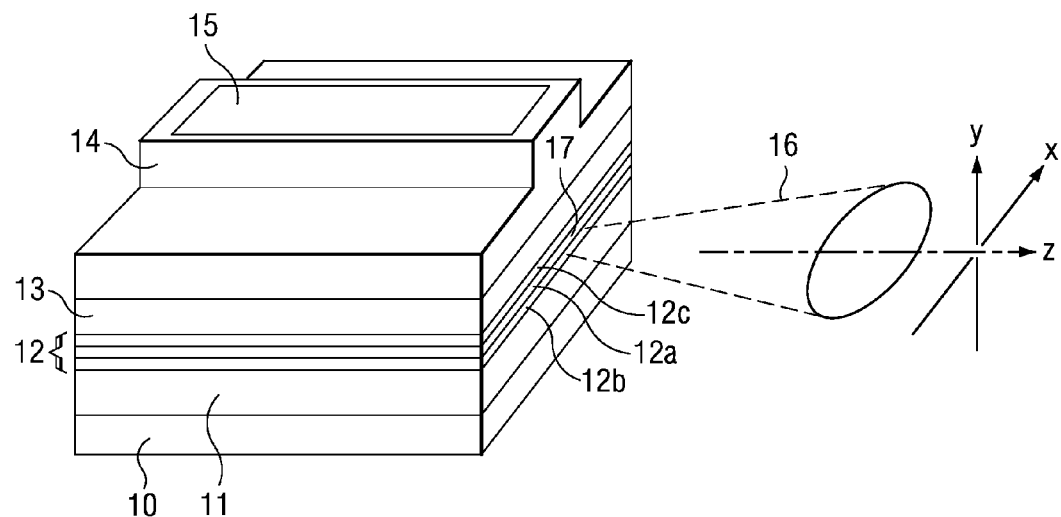
FIG. 1 illustrates a conventional semiconductor laser device with a ridge waveguide.
Figure 3:
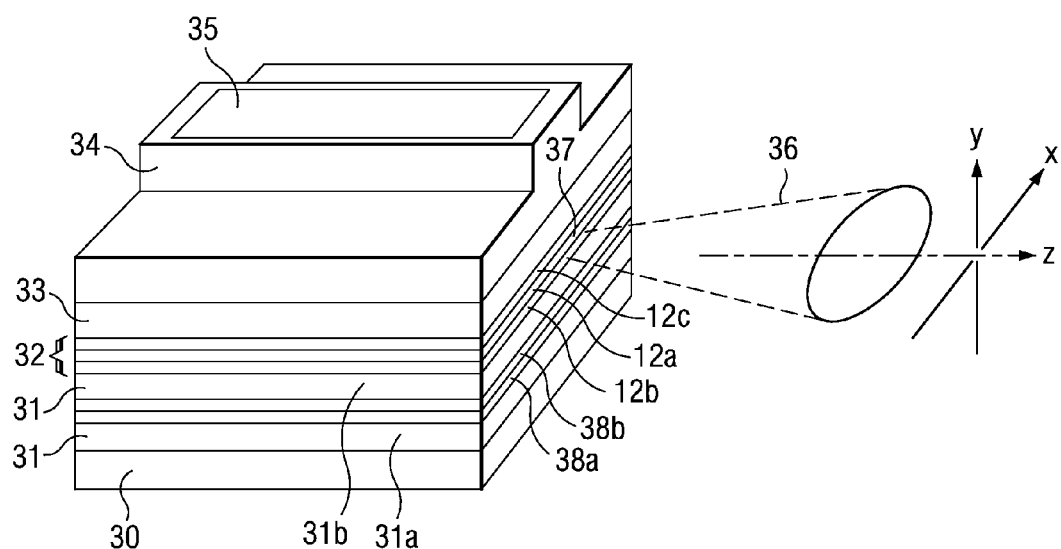
FIG. 3 illustrates a semiconductor laser device having a far-field reduction layer according to a presently preferred embodiment of the present invention.
Figure 2:
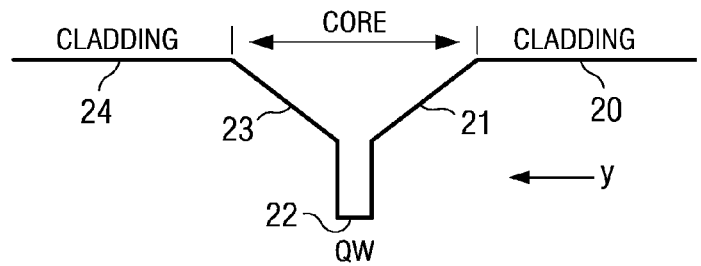
FIG. 2 is a schematic diagram of the conduction band edge of the semiconductor device of FIG. 1.

With reference to FIG. 3 a preferred configuration of device according to the present invention is shown schematically. A substrate 30 supports a lower cladding layer 31, an optically active core region 32 and an upper cladding layer 33. In the preferred arrangement, a ridge waveguide 34 provides lateral optical confinement. A suitable electrical contact material 35 may be deposited onto the ridge 34 with which to provide electrical injection to drive the lasing mode.

It is noted that the principles of the present invention may be applied to laser diodes having other forms of structure providing lateral optical confinement, such as a buried heterostructure laser. It is also noted that the principles of the present invention may also be applied generally to a semiconductor waveguiding structure other than a laser diode. More generally, the principles can be applied in active and passive optical devices with laterally confining waveguide structures. These include amplifiers, modulators and passive waveguides such as those integrated onto a single substrate to form an integrated optical device.

The resultant optical output beam 36 emerges from the output end 37 along the longitudinal or z-axis as shown.

The core region 32 preferably comprises a plurality of layers, such as a central layer 32a defining the quantum well and two or more outer layers 32b, 32c in which the composition varies as a function of depth within the layer to provide a graded index separate confinement heterostructure (GRIN-SCH) core region 32. However, it will be understood that the invention has applicability to laser devices not utilizing a graded index core region.

The lower cladding layer 31 incorporates a far field reduction layer ('FRL') or beam control layer 38. To this end, the lower cladding layer comprises two sub-layers 31a, 31b, between which is formed the beam control layer 38. The beam control layer 38 comprises at least two sub-layers 38a, 38b each formed from semiconductor material whose properties vary gradually through the thickness thereof in a manner to be described in more detail hereinafter.

Figure 4:
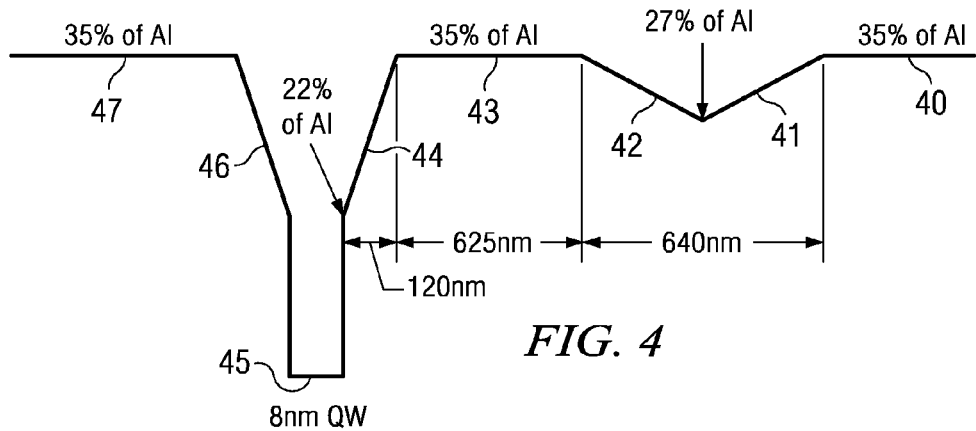
FIG. 4 is a schematic diagram of the conduction band edge of the device of FIG. 3.

The structure of FIG. 3 provides a conduction band edge profile as shown in FIG. 4. The lower cladding region 40 to 43 corresponds to the lower cladding layer 31. More specifically, the region 40 corresponds to the lower cladding sub-layer 31a; the region 43 corresponds to the lower cladding sub-layer 31b; the region 41 corresponds to the lower beam control sub-layer 38a; and the region 42 corresponds to the upper beam control sub-layer 38b. The cladding region 47 corresponds to the upper cladding layer 33; the quantum well region 45 corresponds to the central layer 32a; and the graded index regions 44 and 46 respectively correspond to the outer layers 32b, 32c.

In a particularly preferred embodiment of 830 nm laser, the layer structure of the laser device is a given below:

| Layer No | Ref, FIGS. 3 & 4 | Material (x, y) | Composition | Thickness (μm) | Type | Dopant |
|---|---|---|---|---|---|---|
| 15 | 39 | GaAs | | 0.100 | p | Zn |
| 14 | 33, 47 | Al(x)GaAs | 0.35 > 0.05 | 0.120 | p | Zn |
| 13 | 33, 47 | Al(x)GaAs | 0.35 | 1.700 | p | Zn |
| 12 | 33, 47 | Al(x)GaAs | 0.35 | 0.200 | p | Zn |
| 11 | 32c, 46 | Al(x)GaAs | 0.22 > 0.35 | 0.120 | | U/D |
| 10 | 32a, 45 | (AlxGa)In(y)As | x = 0.14, y = 0.14 | 0.008 | | U/D |
| 9 | 32b, 44 | Al(x)GaAs | 0.30 > 0.22 | 0.070 | | U/D |
| 8 | 32b, 44 | Al(x)GaAs | 0.33 > 0.30 | 0.030 | n | Si |
| 7 | 32b, 44 | Al(x)GaAs | 0.35 > 0.33 | 0.020 | n | Si |
| 6 | 31b, 43 | Al(x)GaAs | 0.35 | 0.625 | n | Si |
| 5 | 38b, 42 | Al(x)GaAs | 0.27 > 0.35 | 0.320 | n | Si |
| 4 | 38a, 41 | Al(x)GaAs | 0.35 > 0.27 | 0.320 | n | Si |
| 3 | 31a, 40 | Al(x)GaAs | 0.35 | 1.400 | n | Si |
| 2 | 31a | Al(x)GaAs | 0.05 > 0.35 | 0.210 | n | Si |
| 1 | 30 | GaAs | | 0.500 | n | Si |

The respective layers of FIGS. 3 and 4 are referenced in column 2 of the above table.

The structure is grown on a GaAs substrate (first layer) with an 8 nm thick InGaAlAs compressively strained quantum well (tenth layer) for 830 nm laser applications using MOCVD or MBE deposition techniques. The quantum well 32a, 45 is surrounded on both sides by 120 nm graded index separate confinement hetero structure layers 32b, 32c, 44, 46 (the $7^{th}$ to $9^{th}$ and $11^{th}$ layers). The third and sixth layers are the lower cladding, sub-layers 31a, 31b, and the $12^{th}$ and $13^{th}$ layers are the upper cladding layer 33, 47. The fourth and fifth layers are the beam control sub-layers for far field reduction. These layers are also used to suppress higher mode lasing and therefore to enhance kink free power.

The thicknesses of the $4^{th}$, $5^{th}$ and $6^{th}$ layers as well as the mole fraction of Al at the middle point of the $4^{th}$ and $5^{th}$ layers are, in this embodiment, optimized such that all the following criteria are achieved:
 i) full width at half maximum (FWHM) of vertical far field is about 21 degrees;
 ii) optical overlap reduction due to the beam control layer is very insignificant;
 iii) excellent device performance for wafer growth tolerance of ±10% of layer thickness, and ±1% of layer mole fraction;
 iv) significant suppression of higher mode lasing.

Device fabrication can be performed using conventional photolithographic techniques and dry or wet etch, followed by wafer thinning and metal contact deposition.

Figure 5:
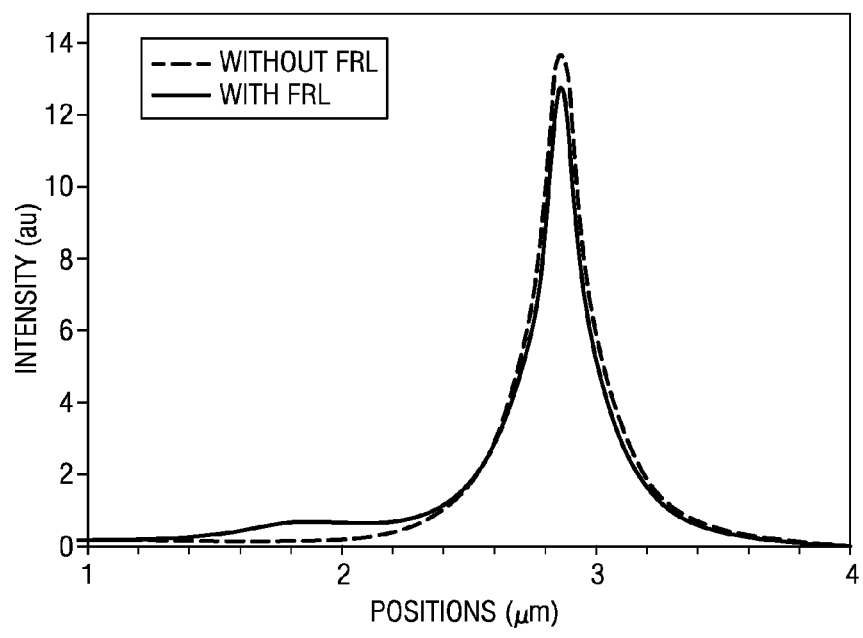
FIG. 5 is a graph showing a comparison of the near field optical intensity distributions of the respective optical outputs of the laser devices of FIGS. 1 and 3 as a function of y-position.
Figure 6:
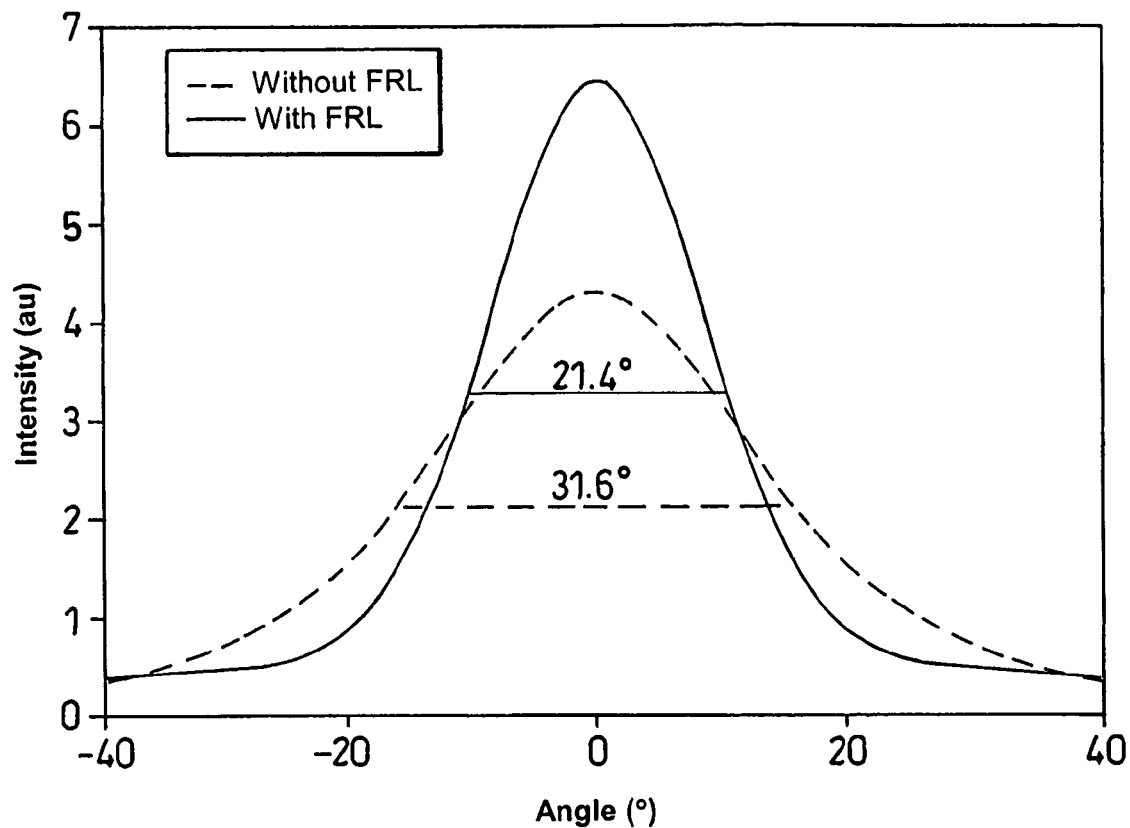
FIG. 6 is a graph showing a comparison of the far field optical intensity distributions of the respective optical outputs of the laser devices of FIGS. 1 and 3 as a function of y-position.

FIGS. 5 and 6 show simulated near field intensity distribution and far field distribution for the fundamental mode of a 2.5 mm wide ridge laser, as a function of y position, with and without the beam control layers 38a, 38b, 41, 42.

In FIG. 5, the dotted line represents the near field intensity distribution without beam control layer and the solid line represents the near field intensity with beam control layer. It can be seen that the beam control layer has little impact on the near field intensity distribution. However, in FIG. 6, the dotted line represents the far field intensity distribution without beam control layer and the solid line represents the far field intensity distribution with beam control layer. It can be seen that the beam control layer has substantial impact on the intensity distribution, providing a much narrower peak with substantially greater intensity maximum.

The etching of the ridge 34 of the laser device plays an important role in the device's kink-free power and the ellipticity of the output beam, as higher mode lasing and horizontal far field are strongly dependent on the etch step.

Comparison can be made between devices processed using structures with and without the beam control layer. In order to make the comparison more meaningful, the criteria for the same horizontal far field are used. In this case, devices processed on the structure with mode control need to be etched to a depth 50 nm greater than those processed without the mode control layers. The comparisons are shown for a device having a 2.2 mm wide ridge and a 1.2 mm long cavity.

Figure 7:
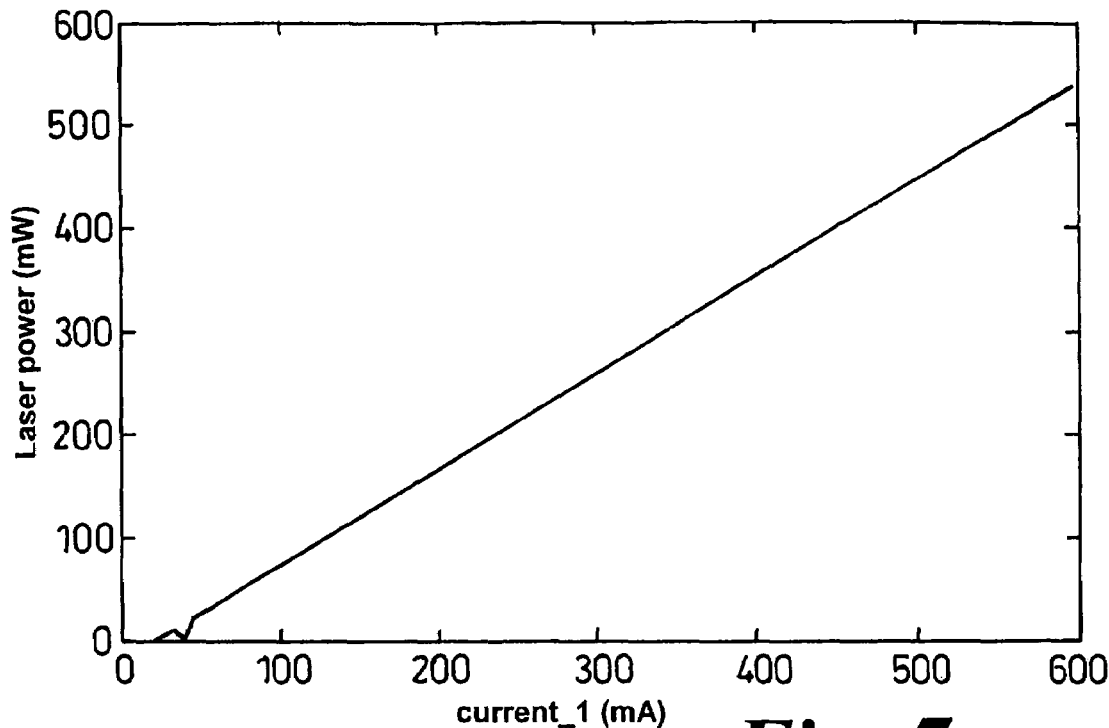
FIG. 7 is a graph showing fundamental transverse mode light intensity output as a function of drive current for the laser of FIG. 3.
Figure 9:
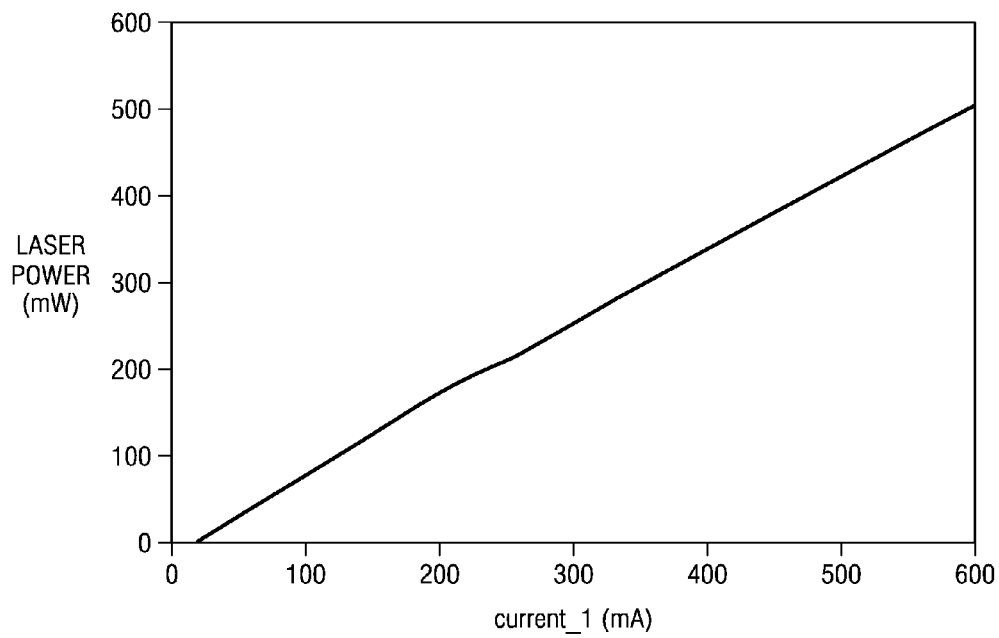
FIG. 9 is a graph showing fundamental transverse mode light intensity output as a function of drive current for the laser of FIG. 1.

FIG. 7 shows the laser power as a function of drive current for the fundamental (first) mode in a device with the beam control layer 38a, 38b. FIG. 9 shows laser power as a function of drive current for the fundamental mode in a corresponding device without the beam control layer. It can be seen that there is substantially no difference.

Figure 8:
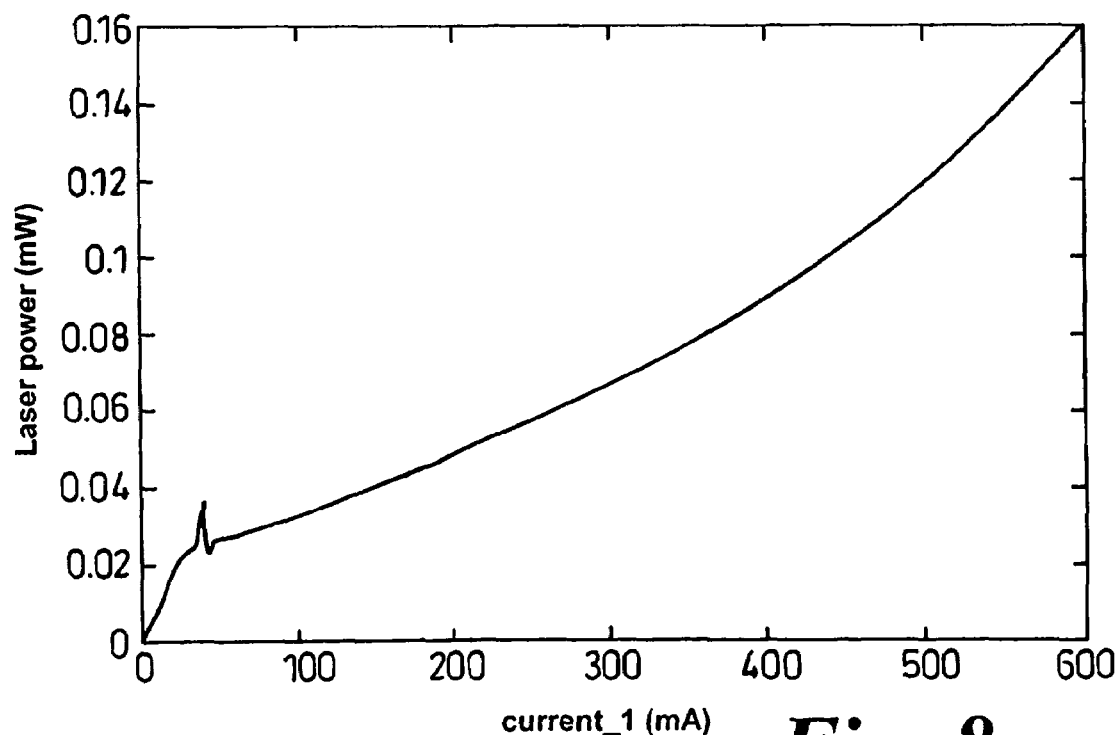
FIG. 8 is a graph showing second order transverse mode light intensity output as a function of drive current for the laser of FIG. 3.
Figure 10:
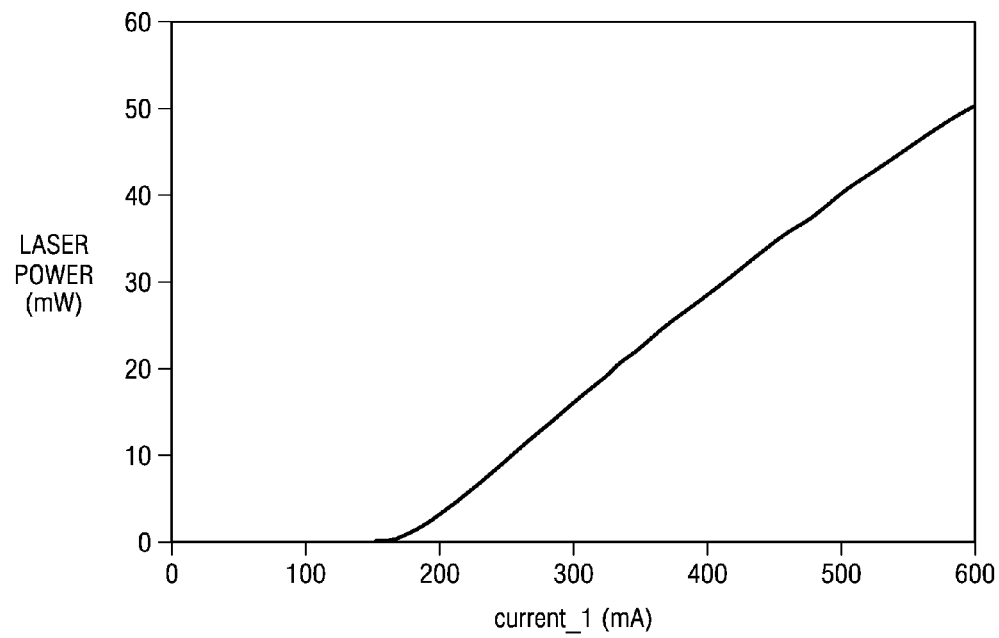
FIG. 10 is a graph showing second order transverse mode light intensity output as a function of drive current for the laser of FIG. 1.

However, FIG. 8 shows the laser power as a function of drive current for the higher (second) mode in a device with the beam control layer 38a, 38b. FIG. 10 shows laser power as a function of drive current for the higher mode in a corresponding device without the beam control layer. It can be seen that there is a huge difference of device performance in terms of higher mode lasing. More particularly, for the device structure with beam control layers, no power kink is observed for injection current up to 600 mA, while in the case of the device structure without beam control layers, the power kink occurs when injection current reaches only 175 mA.

The prior art generally proposes mode control layers that include a step discontinuity in the refractive index of the cladding layers. In the present invention, it has been discovered that the use of a graded beam control layer, and in particular, the use of a V-profile beam control layer, provides substantial improvements in device performance. Another advantage is that with the graded beam control layer of the present invention, much less tight control of growth conditions is required to achieve the desired mode control.

This is demonstrated in the following table which shows the variations in vertical far field and optical overlap as a function of 1% changes in mole fraction of Al, for both devices without beam control layers and with the beam control layers. Variations in both vertical far field and optical overlap are much more tightly controlled in the present invention.

| With mode control layer | | | Without mode control layer | | |
| --- | --- | --- | --- | --- | --- |
| Mole fraction of Al | Vertical far field (°) | Optical overlap (%) | Mole fraction of Al | Vertical far field (°) | Optical overlap (%) |
| 26% | 19.4 | 1.86 | 30% | 17.3 | 1.58 |
| 27% | 21.4 | 2.26 | 31% | 21.4 | 2.36 |
| 28% | 23.6 | 2.38 | 32% | 25.7 | 2.46 |

Another advantage of the V-profile beam control layer is that it can eliminate possible problems with carrier trapping in the beam control layer leading to better carrier transportation and improved L-I (light intensity versus drive current) slope efficiency.

The embodiment described above illustrates the use of a beam control layer 38 in which the first (lower) cladding layer 31 incorporates two beam control sub-layers 38a, 38b in which a physical property (the stoichiometric ratio) of the semiconductor material varies as a function of depth (y) through each of the sub-layers 38a, 38b so as to vary an electronic property (the conduction band edge) and an optical property (the refractive index) of the sub-layer respective sub-layer.

More particularly, the physical property of the beam control sub-layers 38a, 38b varies so as to provide a substantially linear decrease, then increase, in conduction band edge 41, 42 in the beam control layer 38 to provide a substantially 'V' shaped profile. However, it is to be understood that the profile may be varied.

Figure 11:
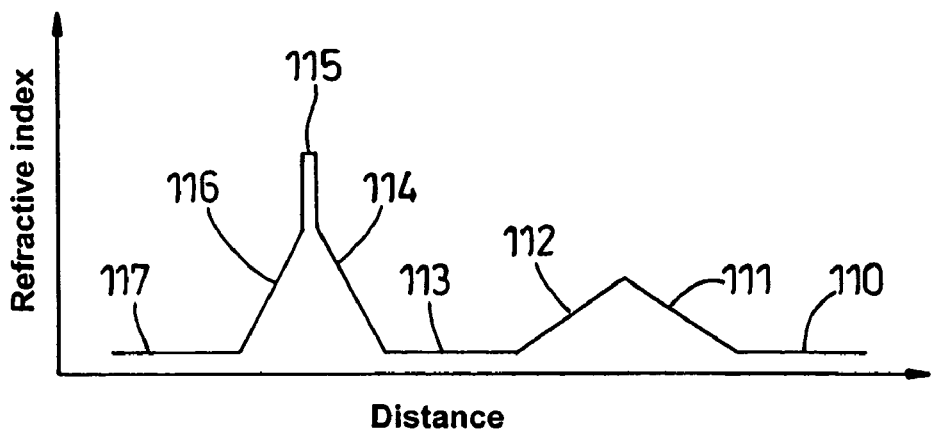
FIG. 11 is a schematic diagram of refractive index profile as a function of depth (y direction) in a first configuration of device of FIG. 3.

A non-exhaustive selection of possible refractive index versus depth profiles for beam control layers are shown in FIGS. 11 to 17. In FIG. 11, the refractive index profile corresponds substantially to the conduction band edge profile illustrated in FIG. 4, comprising: (i) low refractive index lower cladding region 110; (ii) lower beam control sub-layer region 111 having a linearly increasing refractive index as a function of y; (iii) lower beam control sub-layer region 112 having a linearly decreasing refractive index as a function of y; low refractive index lower cladding region 113; graded index confinement regions 114 and 116; quantum well region 115; and upper cladding region 117.

More generally, the beam control layer includes a first sub-layer 38a in which the physical property varies gradually from a first level to a second level, and a second sub-layer 38b in which the physical property varies gradually from said second level to a third level, as exemplified by each one of the refractive index profiles of FIGS. 11 to 17.

Figure 14:
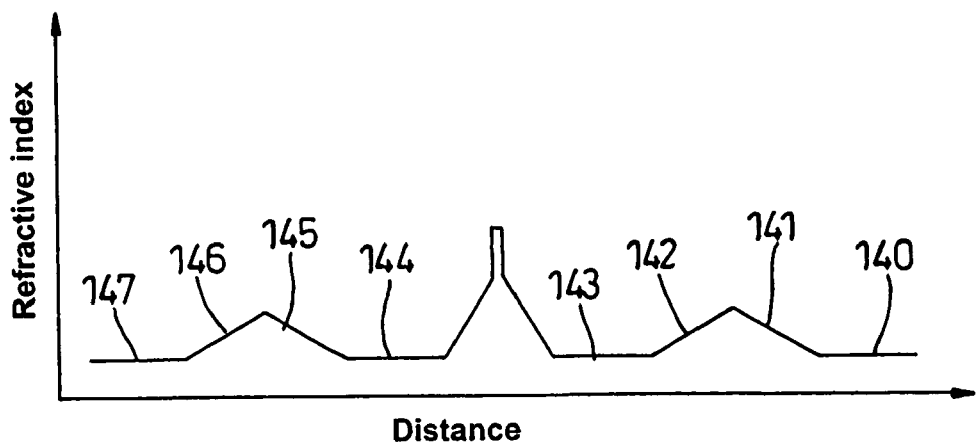
FIG. 14 is a schematic diagram of refractive index profile as a function of depth in a fourth configuration of device of FIG. 3.
Figure 15:
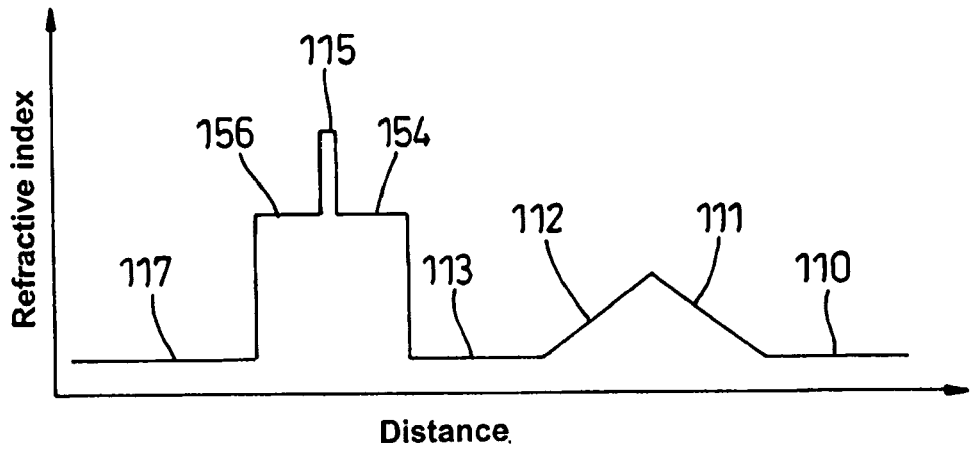
FIG. 15 is a schematic diagram of refractive index profile as a function of depth in a fifth configuration of device of FIG. 3.
Figure 16:
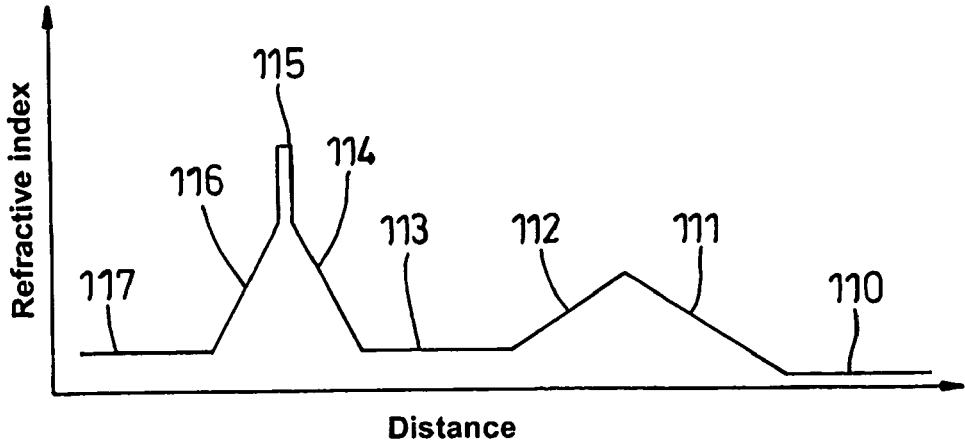
FIG. 16 is a schematic diagram of refractive index profile as a function of depth (y direction) in a sixth configuration of device of FIG. 3.

The third level may be the same as the first level, such that the lower cladding sub-layers 31a and 31b have substantially the same physical properties, as in FIGS. 11 to 15 and 17. Alternatively, one part of the cladding region (e.g. 110) may have a different refractive index value to that of the other part of the cladding region (e.g. 113). More particularly, the lower (or outermost) part of the cladding region (e.g. 110) may have a lower refractive index value than the other part of the cladding region (e.g. 113) as shown in FIG. 16.

Figure 13:
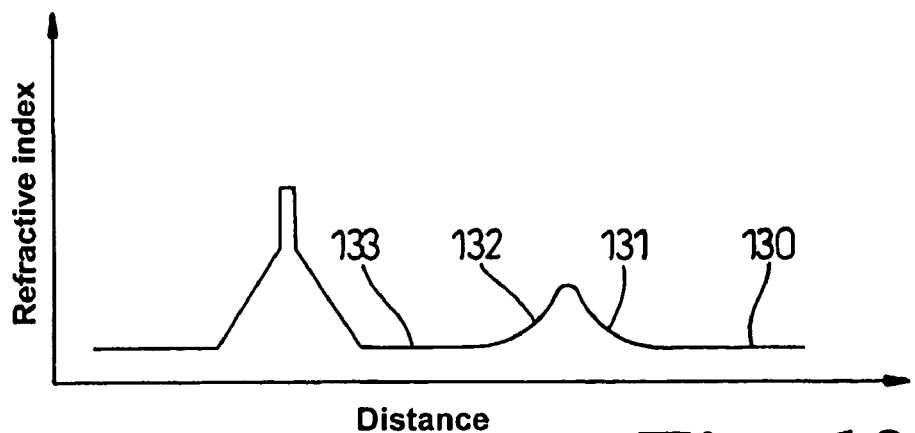
FIG. 13 is a schematic diagram of refractive index profile as a function of depth in a third configuration of device of FIG. 3.

The physical property may vary in a non-linear manner so as to provide a non-linear variation in conduction band edge and/or refractive index as a function of depth through the first and second sub-layers. Such an arrangement is shown in FIG. 13 where the first sub-layer 131 of the beam control layer has a gradually increasing refractive index in which the increase is non-linear. Similarly the second sub-layer 132 of the beam control layer has a gradually decreasing refractive index in which the decrease is non-linear.

Figure 12:
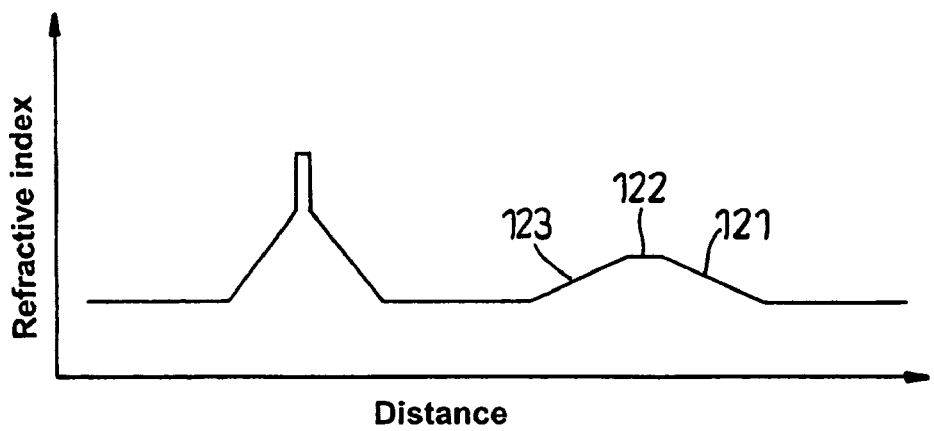
FIG. 12 is a schematic diagram of refractive index profile as a function of depth in a second configuration of device of FIG. 3.

The beam control sub-layers 38a and 38b may be contiguous, i.e. without further sub-layers in between as in FIGS. 11 and 13 to 17. However, in another embodiment, the beam control sub-layers 38a, 38b may be separated by a further sub-layer, e.g. to provide a flat-bottomed V-profile in the conduction band edge, or flat topped inverted V-profile in the refractive index, as shown in FIG. 12. In FIG. 12, the beam control layer provides a lower beam control sub-layer 121 of gradually increasing refractive index, an upper beam control sub-layer 123 of gradually decreasing refractive index, and an intermediate beam control sub-layer 122 of substantially constant refractive index.

The beam control layer 38 may be provided within the lower cladding layer 31, the upper cladding layer 33, or in beam control layers may be provided in both lower and upper cladding layers. This latter example is illustrated by the refractive index profile in FIG. 14. FIG. 14 shows a first beam control layer comprising sub-layers 141, 142 within the lower cladding layer 140, 143, and a second beam control layer comprising sub-layers 145, 146 within the upper cladding layer 144, 147.

Figure 17:
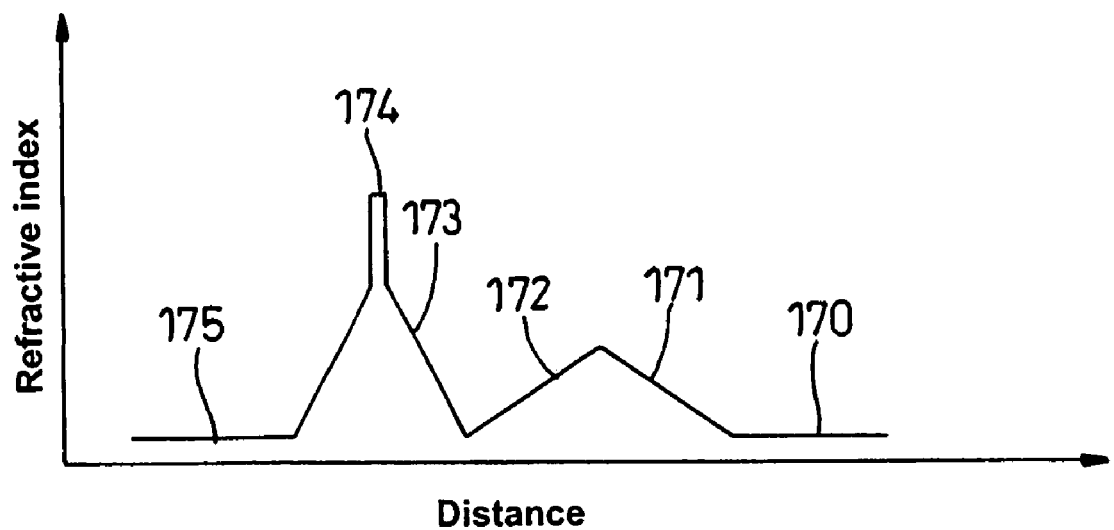
FIG. 17 is a schematic diagram of refractive index profile as a function of depth in a seventh configuration of device of FIG. 3.

The beam control layer may be located in the cladding layer immediately adjacent to the quantum well structure or GRINSCH structure as illustrated in FIG. 17. In FIG. 17, beam control sub-layer regions 171, 172 are located between the lower cladding region 170 and the GRINSCH region 173.

As previously mentioned, the lateral optical confinement structure, e.g. quantum well region 115 need not be sandwiched between graded index confinement regions 114, 116 (e.g. FIG. 11). As shown in FIG. 15, the quantum well region 115 may be sandwiched between stepped index confinement regions 154, 156.

The beam control layer can generally be deployed in either p-cladding layers or n-cladding layers, although n-cladding layers is preferred since it does not affect any cladding etch process.

An important aspect of the present invention is the use of a beam control layer in the cladding layer that has a gradually varying property rather than a single large step change. The gradual change occurs through a thickness of at least 50 nm in the beam control layer. More preferably, the gradual change in property occurs in a first direction over a beam control sub-layer of at least 100 nm thickness, and then in a second direction opposite to the first direction over a beam control sub-layer of at least 100 nm thickness.

Figure 18:
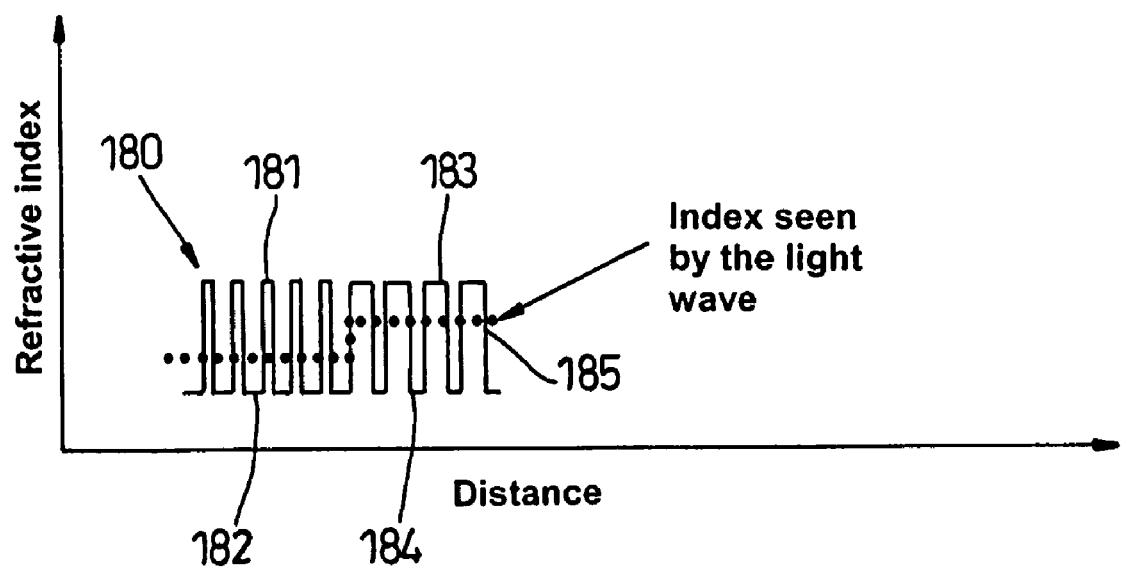
FIG. 18 is a schematic diagram useful in illustrating the principles of varying refractive index in a semiconductor material using superlattice structures.

It is noted that this 'gradual change' is effectively defined relative to the optical wavelength of the light passing therethrough. It is also possible to create such a gradual change in refractive index in a semiconductor layer by building a superlattice type structure or digital alloy in which alternating layers of low and high refractive index material are formed with a localized average thickness ratio that defines the effective refractive index over a dimension of the order of one wavelength of light or less. The principle of this is illustrated in FIG. 18.

Thus, a succession of step changes 180 between sub-layers of low 182 and high 181 refractive index material in which each sub-layer has a thickness substantially less than the wavelength of light can effect a gradual change in refractive index by slowly varying the ratio of high to low sub-layer thicknesses as indicated by sub-layers 183, 184. The net effect is a corresponding gradual change in refractive index 185 as seen by the light propagating with the layer.

It will also be understood that the gradual change can generally be effected by a 'staircase'-type succession of small, stepwise increments or decrements in the material property (e.g. refractive index) to form the beam control layer, with each successive step being of thickness substantially less than the wavelength of light propagating in the layer.

In presently preferred embodiments, the gradual change in refractive index results in a change in refractive index of at least 0.1% in a beam control sub-layer over at least 100 nm thickness.

In the preferred embodiments, over the range of desired changes in refractive index, the corresponding changes in bandgap profile and semiconductor material composition are related thereto in a substantially linear fashion.

The invention has applicability to a wide range of semiconductor materials systems in particular, though not exclusively, those listed in the table below.

| Quantum well material | Barrier material | Cladding material | Substrate |
| --- | --- | --- | --- |
| InGaAs | AlGaAs | AlGaAs | GaAs |
| GaAs | AlGaAs | AlGaAs | GaAs |
| InGaAlAs | AlGaAs | AlGaAs | GaAs |
| InGaAs | InGaP | InGaAlp | GaAs |
| InGaAs | GaAs | InGaP | GaAs |
| InGaAs | InGaAsP | InGaP | GaAs |
| InGaAsN | AlGaAs | AlGaAs | GaAs |
| InGaAsP | InGaAsP | InP | InP |
| InGaAlAs | InGaAlAs | InP | InP |

Other embodiments are intentionally within the scope of the appended claims.

The invention claimed is:

1. An optical waveguiding device for guiding therethrough light of a predetermined wavelength, the device formed of semiconductor material, the device comprising:
   a first cladding layer;
   a second cladding layer; and
   a waveguiding layer disposed between the first and second cladding layers and having a substantially higher refractive index than said first and second cladding layers;
   wherein at least one of the first and second cladding layers includes a beam control layer in which the refractive index of the semiconductor material gradually varies, as seen by light propagating through the device, as a function of depth through the layer, the beam control layer including a first sub-layer in which the refractive index varies gradually from a first level to a second level, and a second sub-layer contiguous with the first sub-layer in which the the refractive index varies gradually from said second level to a third level, the third level being substantially equal to the first level.

2. The device of claim 1 in which a further property of the semiconductor material that varies as a function of the depth through the layer is the composition ratio of the material.

3. The device of claim 1 in which the first sub-layer provides a gradually decreasing conduction band edge, and the second sub-layer provides a gradually increasing conduction band edge.

4. The device of claim 1 in which the first sub-layer provides a gradually increasing refractive index as a function of proximity to the second sub-layer and the second sub-layer provides a gradually decreasing refractive index as a function of remoteness from the first sub-layer.

5. The device of claim 1 in which the first sub-layer is adjacent a cladding layer, the first level being substantially equal to the level of the refractive index in the adjacent cladding layer.

6. The device of claim 1 in which the second sub-layer is adjacent a cladding layer, the third level being substantially equal to the level of the refractive index in the adjacent cladding layer.

7. The device of claim 1 in which the refractive index of the first sub-layer varies between the first level and the second level in a substantially linear manner.

8. The device of claim 1 in which the refractive index of the second sub-layer varies between the second level and the third level in a substantially linear manner.

9. The device of claim 1 in which the first and second cladding layers are formed from a GaAs-based or InP-based system.

10. The device of claim 1 in which the waveguiding layer is a quantum well layer.

11. The device of claim 1 further comprising a substrate, the first cladding layer being a layer most proximal to the substrate, the beam control layer being provided within the first cladding layer.

12. The device of claim 11 in which the substrate comprises GaAs, the first cladding layer and beam control layer comprises n-type AlGaAs, and the second cladding layer comprises p-doped AlGaAs.

13. The device of claim 1 including a ridge waveguide.

14. The device of claim 1 in which the refractive index is gradually varied in the first and second beam control sub-layers by gradually varying thicknesses of alternating sub-sub-layers of the first and second sub-layers of different refractive index, each alternating sub-sub-layer having a thickness substantially less than a wavelength of light.

15. The device of claim 10 comprising any one or more of a laser, an optical modulator and an optical amplifier.

16. A method of forming an optical waveguiding device for propagating therethrough light of a predetermined wavelength, the device formed from semiconductor material, the method comprising the steps of:
   forming a first cladding layer on a substrate;
   forming a waveguiding layer on said first cladding layer, the waveguiding layer having a refractive index substantially greater than the first cladding layer;
   forming a second cladding layer on said waveguiding layer, the second cladding layer having a refractive index substantially less than the waveguiding layer; and
   during the step of forming said first cladding layer, forming a beam control layer therein by gradually modifying deposition conditions so as to vary, as seen by the light propagating through the device, the refractive index of the semiconductor material as a function of depth through the beam control layer, such that the beam control layer includes a first sub-layer in which the refractive index varies gradually from a first level to a second level, and a second sub-layer contiguous with the first sub-layer in which the refractive index varies gradually from said second level to a third level, wherein the third level is substantially equal to the first level.

* * * * *